Figure 1:
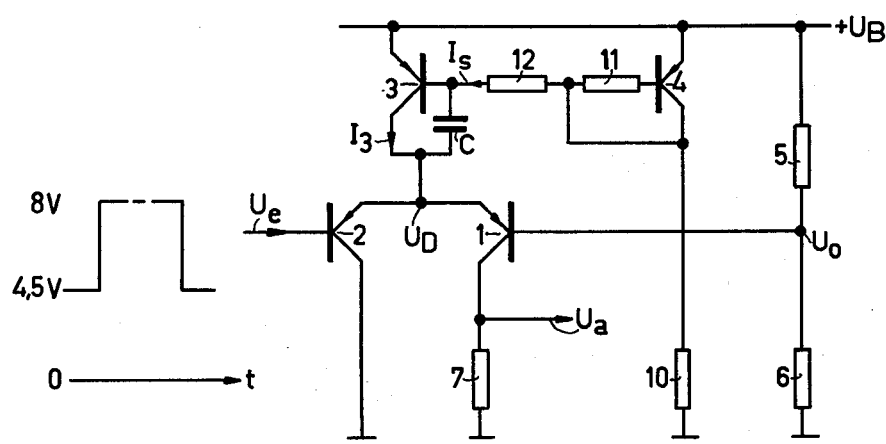

United States Patent [19]
Juhnke et al.

[11] 4,256,981
[45] Mar. 17, 1981

[54] CIRCUIT ARRANGEMENT FOR GENERATING A PULSE WITH A DELAYED EDGE

[75] Inventors: Klaus Juhnke, Rellingen; Hartmut Harlos, Norderstedt, both of Fed. Rep. of Germany

[73] Assignee: U.S. Philips Corporation, New York, N.Y.

[21] Appl. No.: 14,386

[22] Filed: Feb. 22, 1979

[30] Foreign Application Priority Data

Mar. 25, 1978 [DE] Fed. Rep. of Germany ....... 2813127

[51] Int. Cl.³ .............................................. H03K 5/04
[52] U.S. Cl. .................................... 307/266; 307/494
[58] Field of Search ................ 307/265, 266, 267, 230

[56] References Cited

U.S. PATENT DOCUMENTS

| 3,073,972 | 1/1963 | Jenkins | 307/266 |
| 3,209,173 | 9/1965 | Rumble | 307/266 |
| 3,365,586 | 1/1968 | Billings | 307/266 X |
| 3,986,056 | 10/1976 | Tokuda | 307/265 X |

*Primary Examiner*—John S. Heyman
*Attorney, Agent, or Firm*—William J. Streeter; Bernard Franzblau

[57] ABSTRACT

A circuit for generating an output pulse with a delayed edge includes a differential amplifier supplied with current by a current source transistor amplifier whose base drive current is delayed by connecting a small capacitor between its base and collector electrodes.

5 Claims, 3 Drawing Figures

CIRCUIT ARRANGEMENT FOR GENERATING A PULSE WITH A DELAYED EDGE

The invention relates to a circuit arrangement for generating an output pulse having one edge delayed relative to the corresponding edge of an input pulse. The input pulse is applied to the base of a first transistor, which together with a second transistor constitutes a differential amplifier having interconnected emitters that receive a supply voltage from a third transistor. The third transistor is driven by a base current, which may be stabilized, in such a way that in the static condition the third transistor supplies a substantially constant current to the differential amplifier. A capacitor is connected to the third transistor in such a way that temporarily no current is supplied to the interconnected emitters during the condition caused by an edge of the input pulses.

In a known circuit arrangement of this type the delay is obtained by connecting a capacitor between the interconnected emitters and ground, i.e. in parallel with the third transistor which operates as a current source. If the conductive transistor of the differential amplifier is turned off by an edge of the input pulse, and the voltage on the interconnected emitters should change to a greater or smaller value so as to enable the other transistor to be turned on, this change is delayed by the variation in charge of the capacitor which is then necessary. This charge variation is obtained by means of the current supplied by the third transistor; for a specific delay a specific voltage variation across the capacitor is necessary so that the capacitance of said capacitor should be proportioned in accordance with the current.

It is an object of the invention to design the circuit arrangement in such a way that a capacitor of substantially lower capacitance may be used so that integration of the circuit arrangement is simplified.

This object is achieved if, in accordance with the invention, the collector of the third transistor is connected to the emitters of the first and of the second transistor, and if a capacitor is included between the base and the collector of the third transistor and is proportioned so that the delay as a result of the variation in charge of the capacitor is determined by the drive current for the third transistor.

Figure 2A:
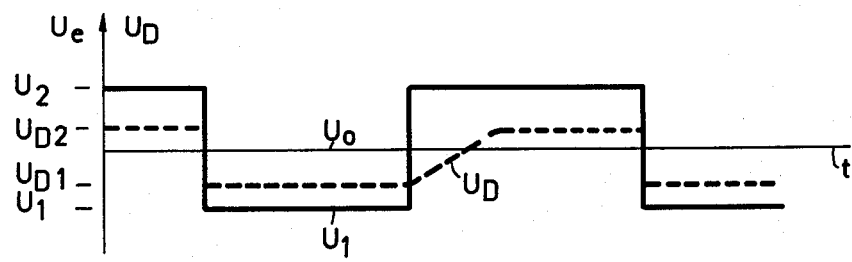
Figure 2B:
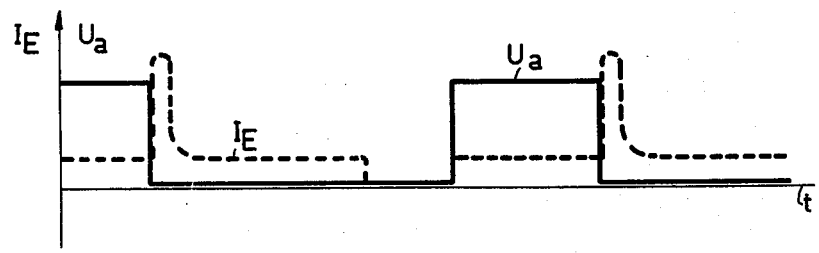

The invention will be described in more detail by way of example with reference to the drawing, in which:

FIG. 1 shows a circuit arrangement in accordance with the invention comprising pnp transistors, and FIGS. 2a and 2b represent the variation of voltages and currents in the circuit of FIG. 1 as a function of time.

The pnp transistors 1 and 2 constitute a differential amplifier. The base of the transistor 1 receives a fixed voltage $U_o$ of 7 V, which is obtained by a voltage divider constituted by the resistor 5 of 5 kohms and the resistor 6 of 7 kohms, which voltage divider is included between the positive pole + of the 12-V power supply source $U_B$ and its negative pole which is connected to ground. A pulse-shaped input signal $U_e$, which is either 4.5 V or 8 V relative to ground, is applied to the base of the transistor 2. A pulse-shaped output voltage $U_a$ is taken from the collector of the transistor 1 across an 1.8 kohm resistor 7 which is included between the collector circuit and ground.

The emitters of the transistors 1 and 2 are interconnected and connected to the collector of a pnp transistor 3, whose emitter is connected to $+U_B$. Via a series resistor 10 the collector of a pnp transistor 4, whose emitter is connected to $+U_B$, is connected to ground and, in addition, via a 10-kohm resistor 11 to its own base and via a 10-kohm resistor 12 to the base of the transistor 3. An essentially constant current is applied to the transistor 4 via the resistor 10 (or a current source circuit). The resistor 11 ensures that the collector voltage and base current of the transistor 4 have the correct values. The collector voltage produces a current $I_s$ via a resistor 12, which is preferably of the same value as the resistor 11. This current flows to the base of the transistor 3 so that the collector of said transistor carries a current $I_3$, which is at least substantially proportional and preferably equal to the collector current of the transistor 4 and substantially independent of the voltage appearing at the collector of the transistor 3.

The voltage $U_e$ at the base of transistor 2, represented by a continuous line in FIG. 2a, varies in a pulsating manner between a value $U_1$ of 4.5 V and a value $U_2$ of 8 V, which values lie more than 1 V below or above the 7-V base voltage $U_o$ of the transistor 1. When the input voltage $U_e$ has the lower value $U_1$, the transistor 1 is cut off, the output voltage $U_a$ is zero, the transistor 2 carries the full current $I_3$ supplied by transistor 3, and the voltage at the emitter of the transistor 2 and thus at the collector of transistor 3 exceeds $U_1$ by the base-emitter voltage difference of substantially 0.7 V. However, if the input voltage $U_e$ has the higher value $U_2$, the transistor 1 conducts and carries the current $I_3$ from transistor 3, whereas transistor 2 is cut off. The voltage at the emitter of the transistor 1 exceeds the voltage $U_o$ by approximately 0.7 V, the collector voltage of the transistor 3 having the same value. At the collector of the transistor 1 an output voltage appears, which corresponds to the voltage drop across the resistor 7. The voltage $U_D$ on the interconnected emitters of the transistors 1 and 2, and thus on the collector of the transistor 3, then varies between two values $U_{D1}$ and $U_{D2}$, which exceed $U_o$ and $U_1$ by the respective base-emitter voltage drop. The values $U_{D2}$ and $U_{D1}$ are represented in FIG. 2a by dashed lines below the peak of the input voltage $U_e$, which is situated at $U_2$, and below the voltage $U_o$ during the lower level of the pulse $U_1$.

In the circuit arrangement described so far the voltage $U_D$ changes instantaneously and directly upon a change of the input voltage $U_e$ from $U_2$ to $U_1$ or $U_1$ to $U_2$. In order to delay an edge of the output pulse relative to the corresponding edge of the input pulse, the collector-emitter junction of the transistor 3 in the known circuit arrangement is connected in parallel with a capacitor which consequently receives the voltage $U_D$. If subsequently the transistor 2 is cut off and is then turned on by $U_1$, the voltage $U_D$ is stored by the capacitor for the time being. However, transistor 2 is highly conductive so that the edge of $U_D$ almost directly follows the edge of $U_e$. However, if the input voltage $U_e$ is increased from $U_1$ to $U_2$ in the reverse direction for the transistor 2, the storage action of the capacitor C ensures that the voltage $U_D$ is maintained, so that transistor 1 also remains cut off. However, transistor 3 is conductive and thus discharges the capacitor C. The voltage $U_D$ thus increases substantially proportionally to the time, as is shown in FIG. 2a to the right of the dashed edge in the centre which changes from $U_1$ to $U_2$. When the voltage $U_D$ has increased so far that transistor 1 is turned on, a corresponding current variation appears across resistor 7 and a corresponding rising edge of the output voltage $U_a$ appears, as is represented by the continuous line in FIG. 2b.

In the known circuit arrangement the capacitor is charged by the full current of the current source transistor 3. For a specific delay it should therefore have a specific higher capacitance value. The delay time T is then substantially $$T = C \cdot (U_{D2} - U_{D1}/I_3)$$

In accordance with the invention a capacitor C of approximately 5 pF. is included between the base and collector of the transistor 3.

If the input voltage $U_e$ then changes from $U_2$ to $U_1$, the transistor 2 becomes highly conductive and a short current surge for charging the capacitor C is produced, as is indicated in FIG. 2b by an upwardly directed peak in the dashed curve. The falling edge of the output pulse $U_a$, which is represented by a continuous line in FIG. 2b, then appears substantially at the same time as the corresponding edge of the input voltage $U_e$. However, when the input voltage $U_e$ increases from the value $U_1$ to $U_2$, transistor 2 is also turned off and the voltage $U_D$, as appears from FIG. 2a, is sustained for the time being as a result of the capacitor C being charged. Through the resistor 12 a smaller current $I_s$ flows, which discharges the capacitor C via the collector-emitter junction of the transistor 3. The base voltage on transistor 3 then assumes such a value that the transistor 3 is turned on by a smaller fraction of the current $I_s$ applied to its base, so that most of the applied current $I_s$ can flow to ground as discharging current via the capacitor C and via the collector-emitter junction.

If, after some time, as a result of the discharge of the capacitor C the voltage $U_D$ has increased so far that transistor 1 is turned on, a rising edge appears in the voltage $U_a$, which then remains constant until the next pulse edge occurs because the voltage of the capacitor C no longer varies.

As, in the circuit arrangement in accordance with the invention, the current of transistor 3 which flows in the static condition is no longer used for charging the capacitor, but only the essentially smaller drive current applied via the resistor 12, the value of the capacitor C may be substantially smaller than in the known circuit arrangement for the same time delay.

The time delay may now be calculated as follows:

$$T = C \cdot (U_{D2} - U_{D1}/I_3) \cdot (I_3/I_s);$$

the quotient $I_3/I_s$ may then be regarded as the factor gained when using the circuit arrangement in accordance with the invention.

For a high current gain $I_s$ can be derived by approximation from the equation $$(U_T/R)\ln(I_3/I_s - 1) - I_3 = 0.$$

($U_T$ is the temperature voltage, KT/q with k the Bolzmann constant, q the charge of the electron and T the Kelvin temperature.

At a smaller current gain $I_s$ is greater, i.e. the extension factor is smaller.

In an arrangement in accordance with FIG. 1 an extension factor of approximately 12 was obtained with a current gain factor 20 for the transistor 3. The delay time T was approximately 0.6 microseconds.

In the circuit arrangement shown the rising edge of the input pulse is delayed. However, if the circuit arrangement in accordance with the invention uses npn-transistors in an equivalent arrangement, the falling edge is delayed in a similar manner.

What is claimed is

1. A circuit arrangement for generating an output pulse having one edge delayed relative to the corresponding edge of an input pulse comprising, first and second transistors connected together to form a differential amplifier with interconnected emitters coupled to a supply voltage source via a third transistor, means for applying said input pulse to the base of the first transistor, means for applying a drive current to the base of the third transistor in such a way that in the static condition the third transistor supplies a substantially constant current, means connecting the collector of the third transistor to the interconnected emitters of the first and second transistors, and means connecting a capacitor between the base and the collector of the third transistor which is proportioned so that a delay occurs as a result of a variation in charge of the capacitor which delay is determined by the drive current for the third transistor thereby to delay the current supplied by the third transistor to the interconnected emitters for one edge of an input pulse.

2. A circuit arrangement as claimed in claim 1 wherein said drive current applying means comprises the series connection of a resistor and the collector-emitter junction of a fourth transistor coupled to said supply voltage source, and means connecting the collector of said fourth transistor to its base via a series resistor and to the base of the third transistor via a second resistor through which the base drive current flows.

3. A circuit for delaying the edge of an output pulse relative to the corresponding edge of an input pulse comprising, first and second transistors connected together as a differential amplifier with their emitter electrodes interconnected, an input terminal for said input pulse coupled to the base of the first transistor for causing the first and second transistors to switch-over in response to an input pulse appearing at said input terminal, a third transistor, a pair of supply terminals for connection to a source of DC supply voltage for the circuit, means connecting the third transistor in series with the differential amplifier across said supply terminals and with an output electrode of the third transistor connected to said interconnected emitter electrodes of the differential amplifier, a source of base drive current coupled to the base of the third transistor and arranged so that the third transistor supplies a constant current to said differential amplifier, a capacitor, means connecting the capacitor between the base and output electrode of the third transistor whereby the switch-over of the differential amplifier in response to an edge of the input pulse is delayed as a function of the capacitance of the capacitor and the current gain of the third transistor, and means coupling an output terminal of the circuit to a collector of one of said first and second transistors.

4. A circuit as claimed in claim 3 wherein said source of base drive current comprises, a fourth transistor connected in series with a first resistor across said supply terminals, second and third resistors, and means connecting an output electrode of the fourth transistor to its base via said second resistor and to the base of the third transistor via the third resistor.

5. A circuit as claimed in claims 3 or 4 further comprising means connecting the base of the second transistor to a source of reference voltage.

* * * * *